(12) United States Patent
Ash

(10) Patent No.: US 8,598,924 B2
(45) Date of Patent: Dec. 3, 2013

(54) FREQUENCY-LOCKED SYNTHESIZER WITH LOW POWER CONSUMPTION AND RELATED SYSTEM AND METHOD

(75) Inventor: Darrell Lee Ash, Sachse, TX (US)

(73) Assignee: RF Monolithics, Inc., Dallas, TX (US)

( * ) Notice: Subject to any disclaimer, the term of this patent is extended or adjusted under 35 U.S.C. 154(b) by 0 days.

(21) Appl. No.: 13/372,321

(22) Filed: Feb. 13, 2012

(65) Prior Publication Data

US 2013/0207699 A1  Aug. 15, 2013

(51) Int. Cl.
*H03L 7/00* (2006.01)

(52) U.S. Cl.
USPC .......................... 327/143; 327/157; 327/163

(58) Field of Classification Search
USPC ......................................... 327/143, 157, 163
See application file for complete search history.

(56) References Cited

U.S. PATENT DOCUMENTS

| | | | |
|---|---|---|---|
| 3,706,048 A * | 12/1972 | Johnston ........................ 331/53 |
| 4,730,169 A | 3/1988 | Li | |
| 5,455,541 A | 10/1995 | Potier | |
| 5,705,955 A | 1/1998 | Freeburg et al. | |
| 5,890,051 A | 3/1999 | Schlang et al. | |
| 6,473,607 B1 | 10/2002 | Shohara et al. | |
| 6,563,893 B2 | 5/2003 | Smith et al. | |
| 6,804,503 B2 | 10/2004 | Shohara et al. | |
| 6,816,111 B2 | 11/2004 | Krasner | |
| 6,925,135 B2 | 8/2005 | Smith et al. | |
| 6,973,145 B1 | 12/2005 | Smith et al. | |
| 7,030,704 B2 | 4/2006 | White | |
| 7,095,353 B2 | 8/2006 | Sander et al. | |
| 7,133,352 B1 | 11/2006 | Hadad | |
| 7,218,696 B2 | 5/2007 | Smith et al. | |
| 7,218,911 B2 | 5/2007 | Shohara et al. | |
| 7,301,377 B2 | 11/2007 | Tanaka et al. | |
| 7,352,831 B2 | 4/2008 | Quinlan et al. | |
| 7,365,580 B2 | 4/2008 | Martin et al. | |
| 7,388,541 B1 | 6/2008 | Yang | |
| 7,551,911 B2 | 6/2009 | Shohara et al. | |
| 7,587,011 B2 | 9/2009 | Smith et al. | |
| 7,587,017 B2 | 9/2009 | Smith et al. | |
| 7,605,662 B2 | 10/2009 | Kobayashi et al. | |
| 7,639,181 B2 | 12/2009 | Wang et al. | |
| 7,804,367 B2 | 9/2010 | Lee et al. | |
| 7,881,416 B2 | 2/2011 | Smith et al. | |
| 7,948,865 B2 | 5/2011 | Hadad | |
| 2010/0315138 A1 * | 12/2010 | Namba et al. ................. 327/157 |

FOREIGN PATENT DOCUMENTS

GB        2 089 602 A     6/1982

OTHER PUBLICATIONS

Notification of Transmittal of the International Search Report and the Written Opinion of the International Searching Authority, or the Declaration dated May 31, 2013 in connection with International Patent Application No. PCT/US13/25972.

* cited by examiner

*Primary Examiner* — John Poos

(57) ABSTRACT

An apparatus includes a first oscillator configured to generate a reference signal and a second oscillator configured to generate an output signal having a controllable frequency. The apparatus also includes a frequency difference detector configured to generate a difference signal having a frequency based on a frequency difference between the reference signal and the output signal. The apparatus further includes a discriminator configured to modify the frequency of the output signal based on the difference signal. The frequency difference detector can be configured to generate the difference signal having multiple pulses. The discriminator can be configured to count a number of pulses in the difference signal during a specified time period and to modify the frequency of the output signal based on the counted number of pulses. The specified time period can be adjustable.

20 Claims, 5 Drawing Sheets

FREQUENCY-LOCKED SYNTHESIZER WITH LOW POWER CONSUMPTION AND RELATED SYSTEM AND METHOD

TECHNICAL FIELD

This disclosure is generally directed to timing generators. More specifically, this disclosure relates to a frequency-locked synthesizer with low power consumption and a related system and method.

BACKGROUND

Wireless transceivers are routinely being incorporated into smaller and smaller devices. In these types of devices, size and power usage are often important factors in the design of a wireless transceiver. Common phase-locked loop (PLL) synthesizers used in transceivers routinely include a crystal oscillator and multiple dividers. Unfortunately, the dividers often require a large amount of current during operation. Moreover, the physical size of the crystal oscillator may be too large for some applications. In addition, the startup time of a crystal oscillator is often a few milliseconds, which can be excessive for some applications.

SUMMARY

This disclosure provides a frequency-locked synthesizer with low power consumption and a related system and method.

In a first embodiment, an apparatus includes a first oscillator configured to generate a reference signal and a second oscillator configured to generate an output signal having a controllable frequency. The apparatus also includes a frequency difference detector configured to generate a difference signal having a frequency based on a frequency difference between the reference signal and the output signal. The apparatus further includes a discriminator configured to modify the frequency of the output signal based on the difference signal.

In a second embodiment, a system includes a synthesizer having a first oscillator configured to generate a reference signal and a second oscillator configured to generate an output signal having a controllable frequency. The synthesizer also includes a frequency difference detector configured to generate a difference signal having a frequency based on a frequency difference between the reference signal and the output signal. The synthesizer further includes a discriminator configured to modify the frequency of the output signal based on the difference signal. The system also includes a transmitter, a receiver, and/or a transceiver configured to receive and use the output signal.

In a third embodiment, a method includes generating a reference signal and generating an output signal having a controllable frequency. The method also includes generating a difference signal having a frequency based on a frequency difference between the reference signal and the output signal. The method further includes modifying the frequency of the output signal based on the difference signal.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
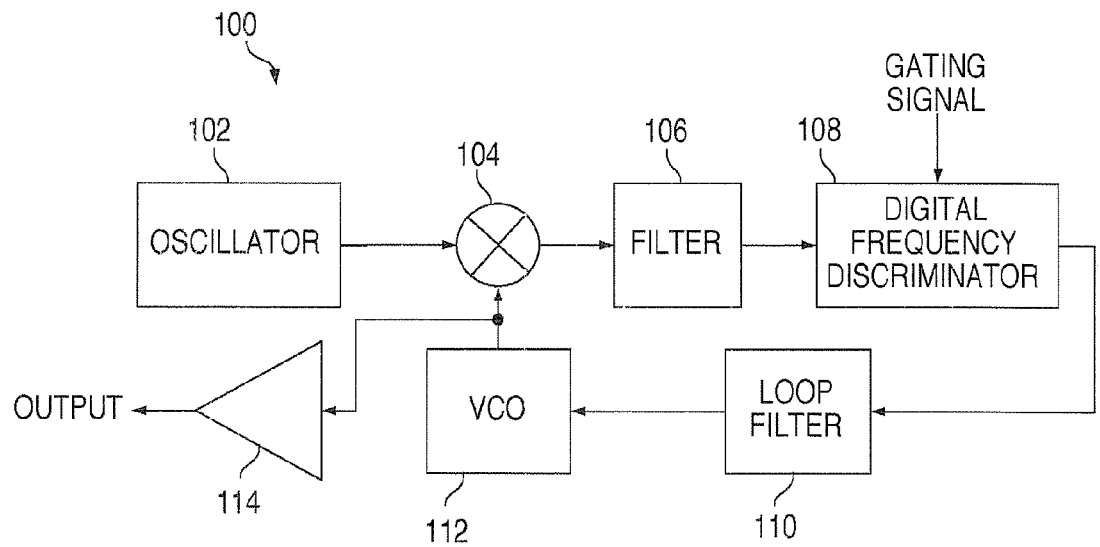
FIG. 1 illustrates an example frequency-locked synthesizer according to this disclosure.

FIG. 1 illustrates an example frequency-locked synthesizer 100 according to this disclosure. As shown in FIG. 1, the synthesizer 100 includes an oscillator 102, which generates a signal having a reference frequency. The oscillator 102 represents any suitable structure for generating a relatively stable reference signal. In some embodiments, the oscillator 102 represents a surface acoustic wave (SAW) stabilized oscillator operating at about 389 MHz.

The oscillator 102 provides the reference signal to a frequency difference detector 104, which also receives an output signal from a voltage controlled oscillator (VCO) 112. The detector 104 generates a difference signal identifying the frequency difference between its input signals. The detector 104 includes any suitable structure for identifying a frequency difference between its inputs, such as a frequency mixer or multiplier. In particular embodiments, the frequency of the output signal generated by the detector 104 varies between about 3 MHz and about 16 Mz.

The output signal generated by the detector 104 is provided to a filter 106, which filters the signal. The filter 106 could, for example, operate so that the only significant component in the filter's output is the difference frequency between the oscillator and VCO's output signals. Among other things, the filter 106 could help reduce or remove any frequencies representing the summation of the oscillator and VCO's frequencies. The filter 106 includes any suitable structure for filtering a signal, such as a low-pass or band-pass filter.

The output signal from the filter 106 is provided to a digital frequency discriminator 108. The discriminator 108 operates to count the number of pulses in the output signal from the filter 106. The discriminator 108 is activated in response to a pulse in a gating signal, which can be provided by any suitable source (such as a processor or other suitable processing or control device). The gating signal defines the period of time that the discriminator 108 counts pulses in the output signal from the filter 106. The discriminator 108 can also be reset for each gating period.

When the number of pulses counted during a gating period is excessive, the discriminator 108 outputs a first signal (such as a high signal). When the number of pulses counted during a gating period is too low, the discriminator 108 outputs a second signal (such as a low signal). When the number of pulses counted during a gating period matches an expected number, the discriminator 108 could tri-state its output or output a third signal (such as a signal between the high and low signals).

The digital frequency discriminator 108 includes any suitable structure for counting pulses in a signal. For example, the discriminator 108 could be implemented using a counter that drives a digital comparator, where the counter counts the pulses in a signal and the digital comparator compares the counter's output to an expected value. In particular embodiments, the digital frequency discriminator 108 includes a sixteen-bit counter.

The output signal from the discriminator 108 drives a loop filter 110, which smoothes the output signal from the discriminator 108. The filtered signal represents a feedback signal that is provided to a tuning input of the VCO 112. The loop filter 110 includes any suitable structure for filtering a signal, such as a low-pass filter or a lead/lag circuit.

The VCO 112 represents an oscillator configured to generate an output signal at an output frequency that is controlled by a voltage from the filter 110. The VCO 112 in this example provides its output signal to the frequency difference detector 104 and an amplifier 114. The VCO 112 includes any suitable structure for generating a signal having a controllable frequency.

The amplifier 114 receives and amplifies the output signal from the VCO 112. The amplifier 114 provides the amplified output signal to any suitable destination(s). For example, the amplifier 114 could provide the amplified output signal to a mixer in a receive path of a transceiver, or the amplifier 114 could provide the amplified output signal directly as a transmit signal in a transmit path of the transceiver. The amplifier 114 includes any suitable structure for amplifying a signal.

In particular embodiments, the synthesizer 100 is used in a transceiver within a medical implant device. The transceiver can operate in the Medical Implant Communication Service (MICS) band, such as from about 402 MHz to about 405 MHz. The intermediate frequency (IF) for a receiver in the transceiver could be about 10 MHz, and the frequency of a transmitter in the transceiver can be generated directly by the VCO 112. The output of the frequency difference detector 104 could vary from about 3 MHz to about 16 MHz. Table 1 identifies example frequencies used during wireless reception, and Table 2 identifies example frequencies used during wireless transmission.

TABLE 1

| Receive Signal (MHz) | VCO Output (MHz) | Frequency Difference Detector Output (MHz) | Counter Gate (μs) |
| --- | --- | --- | --- |
| 402 | 392 | 3 | 85.333 |
| 403 | 393 | 4 | 64 |
| 404 | 394 | 5 | 51.2 |
| 405 | 395 | 6 | 42.667 |

TABLE 2

| Transmit Signal (MHz) | VCO Output (MHz) | Frequency Difference Detector Output (MHz) | Counter Gate (μs) |
| --- | --- | --- | --- |
| 402 | 402 | 13 | 19.692 |
| 403 | 403 | 14 | 18.286 |
| 404 | 404 | 15 | 17.067 |
| 405 | 405 | 16 | 16 |

Note that the values in Tables 1 and 2 are for reference only to illustrate example operations of one specific implementation of the synthesizer 100.

Unlike conventional synthesizers, the frequency at the output of the frequency difference detector 104 changes according to the desired output frequency of the synthesizer 100. Also, the output frequency of the VCO 112 is determined by the width of the gating signal applied to the discriminator 108. Among other things, this design does not require the use of any high-speed dividers, so the amount of electrical current used by the synthesizer 100 can decrease greatly. Moreover, the reference frequency can be supplied by a SAW-stabilized oscillator 102 rather than a crystal oscillator. The SAW device can be much smaller than the crystal. In fact, an entire transceiver could have a size significantly less than 0.1 cm$^3$ in particular embodiments. In addition, the start-up time for the SAW oscillator 102 can be much shorter (such as only a few microseconds) compared to the start-up time of a conventional crystal oscillator (which is typically several milliseconds). As a result, the synthesizer 100 can overcome the size, power, and start-up problems associated with conventional phase-locked loop (PLL) synthesizers.

Although FIG. 1 illustrates one example of a frequency-locked synthesizer 100, various changes may be made to FIG. 1. For example, each component shown in FIG. 1 could be implemented using any suitable circuitry that performs the same or similar function.

Figure 2:
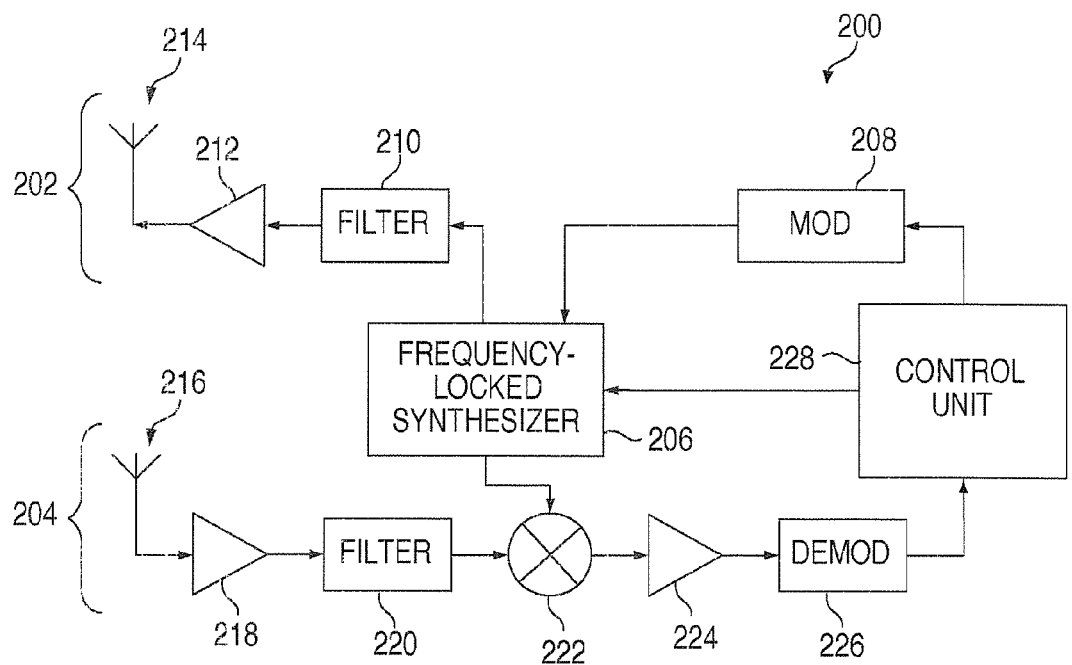
FIG. 2 illustrates an example transceiver containing a frequency-locked synthesizer according to this disclosure.

FIG. 2 illustrates an example transceiver 200 containing a frequency-locked synthesizer according to this disclosure. As shown in FIG. 2, the transceiver 200 includes a transmit path 202 and a receive path 204. The transmit path 202 converts data to be transmitted into a radio frequency (RF) or other signal suitable for wireless transmission, and the receive path 204 processes an RF or other signal received wirelessly.

A frequency-locked synthesizer 206 provides signals to one or both of the transmit and receive paths 202-204. The frequency-locked synthesizer 206 could represent the frequency-locked synthesizer 100 shown in FIG. 1. Note that the output of a single synthesizer 100 could be provided to both the transmit and receive paths 202-204, or separate synthesizers 100 could be used for the transmit and receive paths 202-204.

The transmit path 202 in this example includes a modulator 208, which modulates data to be transmitted. The modulator 208 can use any suitable modulation technique to modulate the data. In this example, the modulator 208 modulates the output of the synthesizer 206, and the synthesizer's output is used directly as the outgoing signal. For example, the modulator 208 could use on/off keying (OOK) modulation to turn the amplifier 114 in the frequency-locked synthesizer 206 on and off. The modulator 208 could also use frequency shift keying (FSK) modulation by controlling the operation of the discriminator 108, such as by altering the width of pulses in the gating signal. The modulated output of the synthesizer 206 is filtered by a filter 210 and amplified by an amplifier 212, such as a low-power amplifier. The amplified signal is transmitted as an outgoing wireless signal through an antenna 214.

The receive path 204 in this example includes an antenna 216, which receives an incoming wireless signal. An amplifier 218 amplifies the received signal, and a filter 220 filters the amplified signal. The filtered signal is down-converted by a mixer 222, which mixes the filtered signal with a lower-frequency signal from the synthesizer 206. The down-converted signal is amplified by an amplifier 224, and a demodulator 226 demodulates data contained in the down-converted signal.

The modulator 208 includes any suitable structure for modulating data. The demodulator 226 includes any suitable structure for demodulating data. Each filter 210, 220 includes any suitable structure for filtering a signal, such as a low-pass or band-pass filter. Each amplifier 212, 218, 224 includes any suitable structure for amplifying a signal. The mixer 222 includes any suitable structure for mixing signals. Each antenna 214, 216 includes any suitable structure for transmitting or receiving a wireless signal. In some embodiments, the transmit and receive paths 202-204 support the use of RF communications, although other suitable wireless signals could be used.

In this example, a control unit 228 is coupled to the transmit and receive paths 202-204. The control unit 228 performs any of a wide variety of functions in the transceiver 200. For example, the control unit 228 can generate or receive data to be transmitted wirelessly and provide that data to the transmit path 202. The control unit 228 can also obtain data received wirelessly and provide that data to one or more external devices or systems. The control unit 228 can further interact with the frequency-locked synthesizer 206, such as by providing one or more gating signals to the frequency-locked synthesizer 206. The control unit 228 includes any suitable structure for controlling a transceiver. For instance, the control unit 228 could include at least one microprocessor, microcontroller, digital signal processor (DSP), field programmable gate array (FPGA), application specific integrated circuit (ASIC), or other processing or control device.

Although FIG. 2 illustrates one example of a transceiver 200 containing a frequency-locked synthesizer, various changes may be made to FIG. 2. For example, other implementations of the transmit and receive paths 202-204 could be used. As a particular example, while the transmit and receive paths 202-204 are shown as having their own antennas 214-216, the paths 202-204 could share a common antenna. Also, various components in FIG. 2 could be combined, further subdivided, or omitted and additional components can be added according to particular needs. For instance, components in a feedback path could be used with the transmit path, such as for echo cancellation. As another example, the functionality of the modulator 208 could be incorporated into the synthesizer 206. In addition, FIG. 2 illustrates one example of an operational environment where the frequency-locked synthesizer 100 could be used. The frequency-locked synthesizer 100 could be used in any other suitable device or system, such as in a transmitter (without a receiver) or in a receiver (without a transmitter).

Figure 3A:
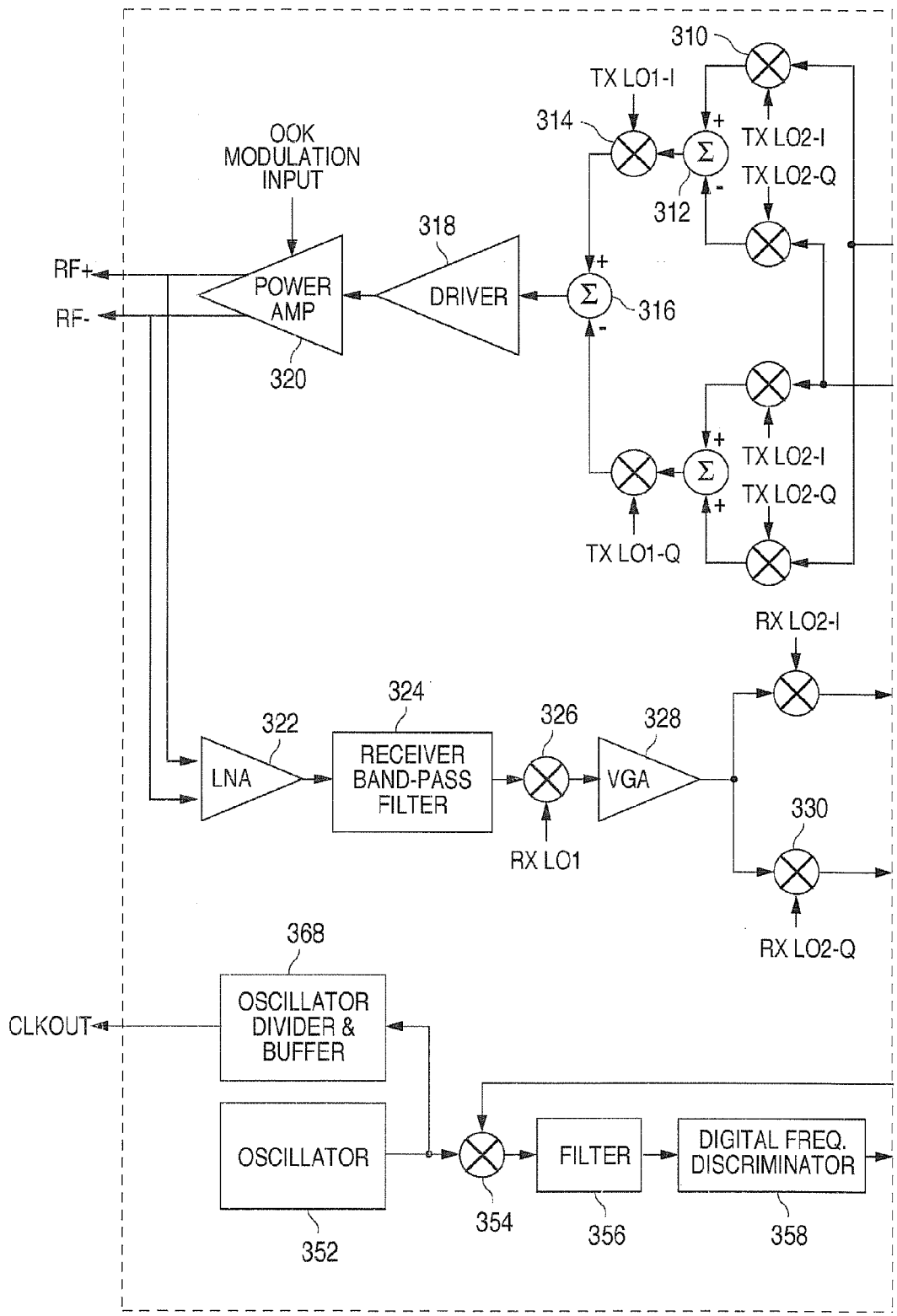
FIG. 3 illustrates a more detailed example transceiver containing a frequency-locked synthesizer according to this disclosure.
Figure 3B:
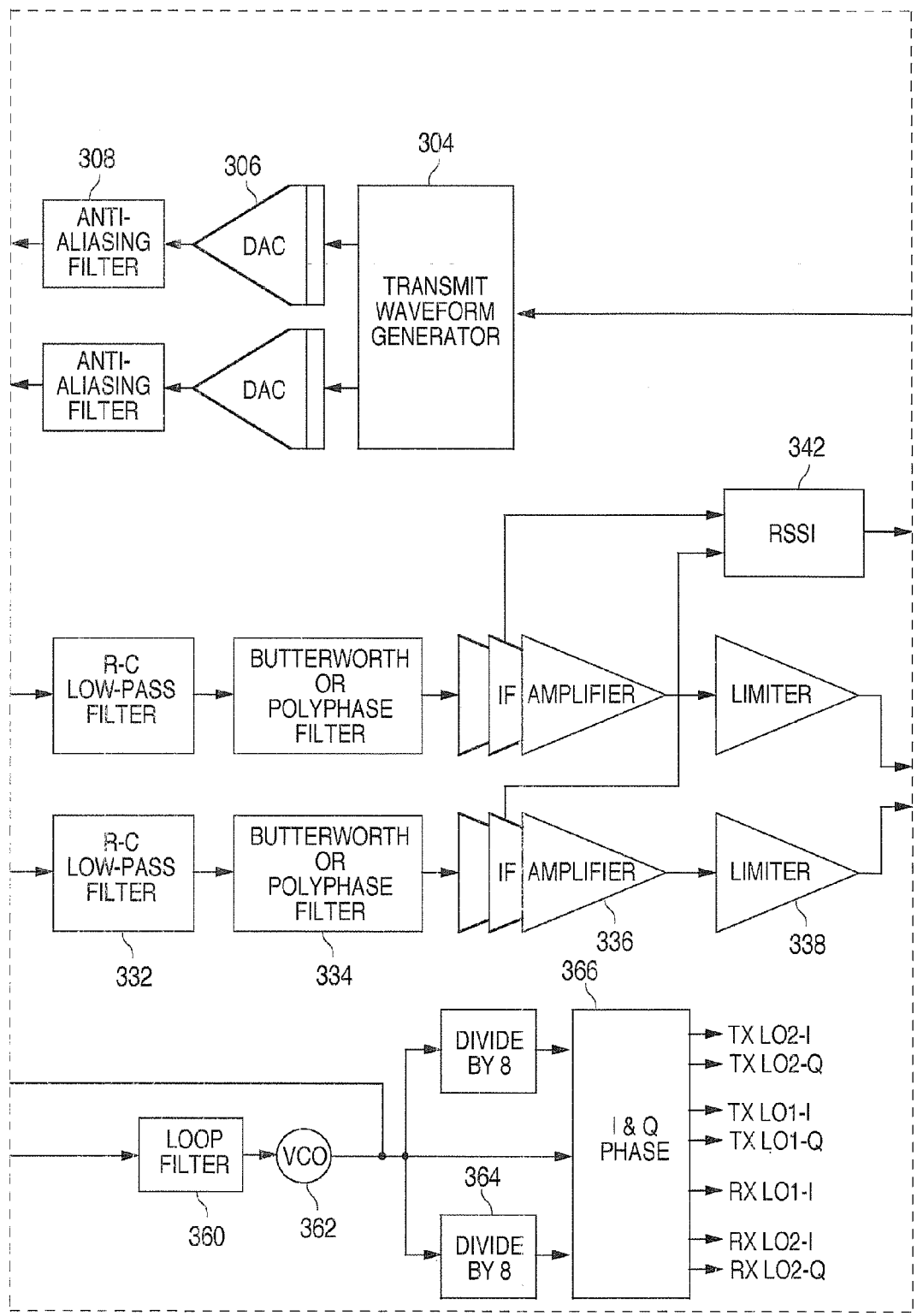
Figure 3C:
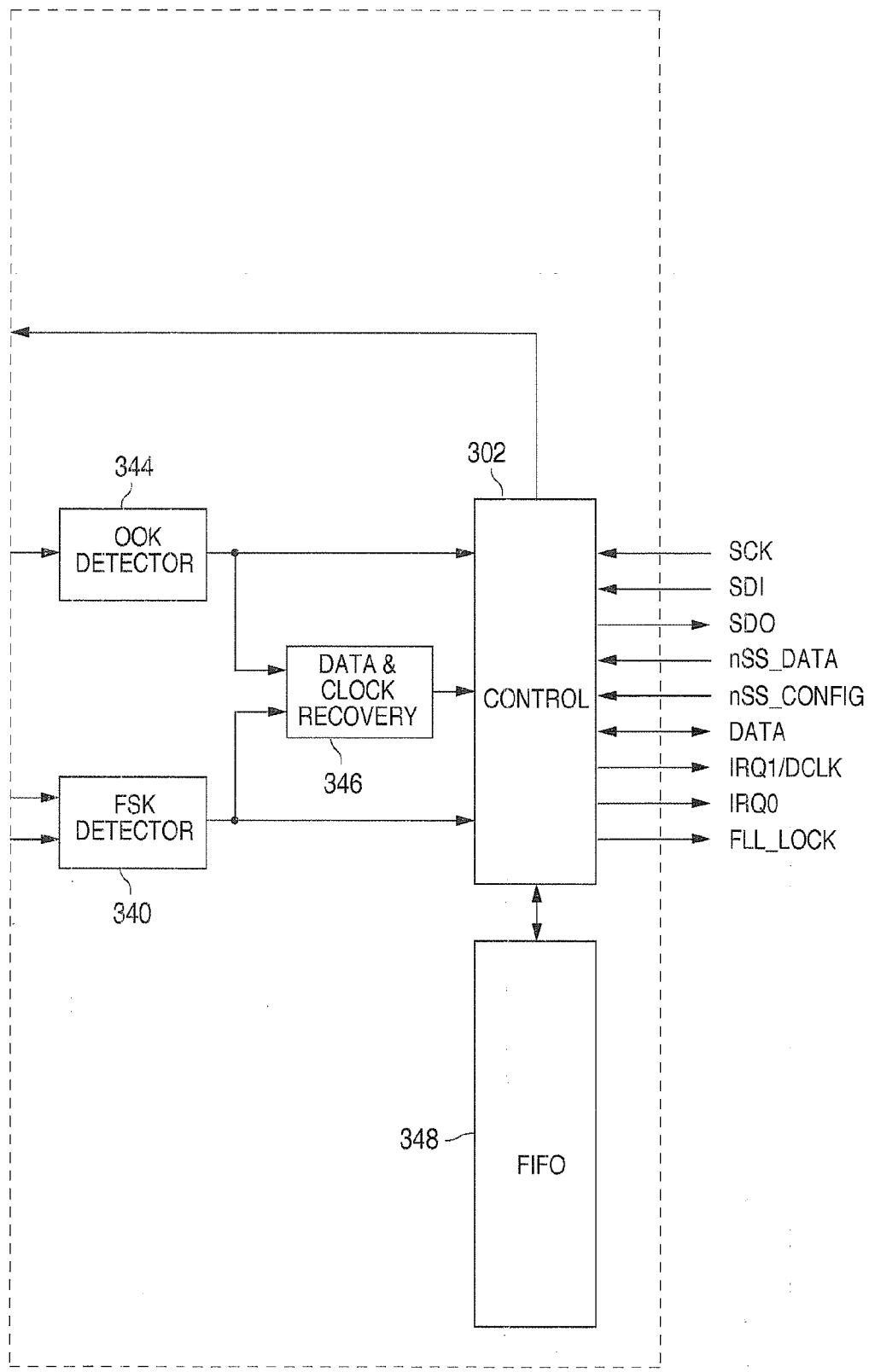

FIG. 3 illustrates a more detailed example transceiver 300 containing a frequency-locked synthesizer according to this disclosure. As shown in FIG. 3, the transceiver 300 includes a control unit 302, which controls the overall operation of the transceiver 300. The control unit 302 can be coupled to various input/output signal lines, such as serial communication lines.

A transmit path in the transceiver 300 includes a transmit waveform generator 304, which generates digital transmit waveforms using data to be transmitted. The transmit waveform generator 304 could also support a modulation scheme, such as FSK modulation. The waveforms are provided to two digital-to-analog converters 306, which convert the digital waveforms into analog signals. The analog signals are filtered using two anti-aliasing filters 308. Four mixers 310 mix the filtered signals with various local oscillator (LO) signals, and two combiners 312 combine the outputs of the mixers 310. Two additional mixers 314 mix the outputs of the combiners 312 with additional LO signals, and a combiner 316 combines the outputs of the mixers 314. A driver 318 drives a power amplifier 320 using the output of the combiner 316. The power amplifier 320 can also support the use of OOK modulation.

A receive path in the transceiver 300 includes a low-noise amplifier (LNA) 322, which amplifies an incoming signal. A filter 324, such as a band-pass filter, filters the amplified signal. A mixer 326 mixes the amplified signal with an LO signal. A variable gain amplifier (VGA) 328 amplifies the output of the mixer 326 and provides a controllable amount of gain. The output of the VGA 328 is provided to two mixers 330, which mix the output with additional LO signals. Two filters 332, such as low-pass resistor-capacitor (RC) filters, filter the outputs of the mixers 330. Two additional filters 334, such as a Butterworth low-pass filter or a polyphase band-pass filter, filter the outputs of the filters 332. The outputs of the filters 334 are amplified by two sets of amplifiers 336, and the amplified signals are provided to two limiters 338. The outputs of the limiters 338 are provided to an FSK detector 340, which demodulates FSK-modulated data. Information from the amplifiers 336 is also provided to two receive signal strength indicator (RSSI) calculators 342, which provide RSSI values to an OOK detector 334 that demodulates OOK-modulated data. The outputs of the FSK detector 340 and the OOK detector 344 are provided to a data and clock recovery unit 346, which recovers clock and data from the incoming signal.

A memory 348 is coupled to the control unit 302. The memory 348 stores any suitable data for use by the control unit 302. The memory 348 includes any suitable structure for storing and facilitating retrieval of data. In this example, the memory 348 represents a first-in, first-out (FIFO) queue.

In this example, the frequency-locked synthesizer from FIG. 1 is used in the transceiver 300 to help generate the various LO signals used by the mixers 310, 314, 326, 330. As shown in FIG. 3, the transceiver 300 includes an oscillator 352, a frequency difference detector 354, a filter 356, a digital frequency discriminator 358, a loop filter 360, and a VCO 362. These components are arranged in the same manner as shown in FIG. 1. The output of the VCO 362 is provided to two "divide by 8" dividers 364 and to an LO unit 366. The LO unit 366 uses the outputs of the VCO 362 and the dividers 364 to generate the LO signals for use in the transmit and receive paths. The output of the oscillator 352 is also provided to a divider and buffer unit 368, which can lower the frequency of the oscillator's output and provide the resulting signal to components outside of the transceiver 300. Although not shown, outputs from the oscillator 352, loop filter 360, and VCO 362 could be provided directly to components outside of the transceiver 300, such as through various input-output pins.

Each component shown in FIG. 3 could be implemented using any suitable circuitry that performs the described function(s). In some embodiments, all of the components shown in FIG. 3 are implemented within a single integrated circuit chip.

Although FIG. 3 illustrates one example of a more detailed transceiver 300 containing a frequency-locked synthesizer, various changes may be made to FIG. 3. For example, other implementations of the transmit and receive paths could be used. Also, other modulation techniques could be supported by the transceiver 300. In addition, various components in FIG. 3 could be combined, further subdivided, or omitted and additional components can be added according to particular needs.

Figure 4:
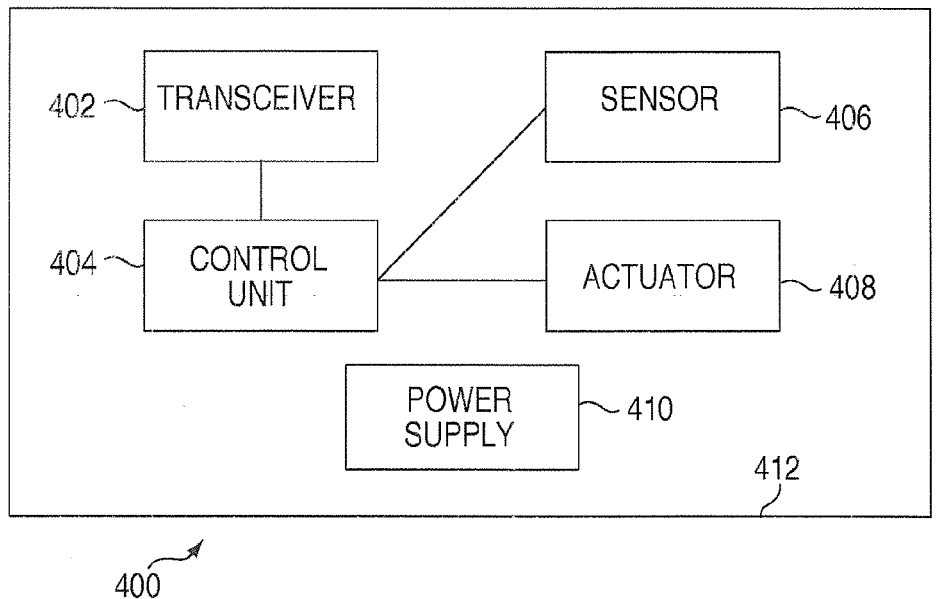
FIG. 4 illustrates an example medical implant containing a frequency-locked synthesizer according to this disclosure.

FIG. 4 illustrates an example medical implant 400 containing a frequency-locked synthesizer according to this disclosure. As shown in FIG. 4, the medical implant 400 includes a transceiver 402 and a control unit 404. The transceiver 402 could represent the transceiver 200 shown in FIG. 2 or the transceiver 300 shown in FIG. 3. However, the transceiver 402 could be replaced by a stand-alone transmitter, a stand-alone receiver, or both. The transceiver 402 also includes a frequency-locked synthesizer, such as the synthesizer 100 shown in FIG. 1.

The control unit 404 controls the overall operation of the implant 400. For example, the control unit 404 could receive measurement data from one or more sensors 406, and the control unit 404 could provide the measurement data to the transceiver 402 for communication. The control unit 404 could also process the data and provide processing results to the transceiver 402 for communication. The control unit 404 could further receive control signals received wirelessly by the transceiver 402, and the control unit 404 could use the signals to adjust operation of one or more actuators 408. The control unit 404 includes any suitable structure for controlling the implant 400. For instance, the control unit 404 could include at least one microprocessor, microcontroller, DSP, FPGA, ASIC, or other processing or control device.

Each sensor 406 represents any suitable mechanism for detecting or measuring one or more characteristics of the implant 400 itself or the environment surrounding the implant 400. The specific sensing operation(s) performed by the sensor(s) 406 could vary depending on the specific use of the implant 400. Each actuator 408 represents any suitable mechanism for performing one or more functions for or within a patient. The specific operation(s) performed by the actuator(s) 408 could vary depending on the specific use of the implant 400.

A power supply 410 provides operating power to various components of the implant 400. The power supply 410 includes any suitable source of power. For instance, in some embodiments, the power supply 410 represents at least one battery that provides intermittent, near continuous, or continuous power to other components of the implant 400. In other embodiments, the power supply 410 collects power from an external source, such as by inductively receiving power from a device near the implant 400. In still other embodiments, the power supply 410 represents a power source that generates power from the surrounding environment, such as by using a piezo-electric power scavenging device.

A housing 412 houses or encases the various other components of the implant 400. The housing 412 can have any suitable shape depending on, for instance, the location of intended implantation for the implant 400. The housing 412 can also be formed from any suitable material(s), such as a biologically suitable material like a polymer or a metal.

Although FIG. 4 illustrates one example of a medical implant 400 containing a frequency-locked synthesizer, various changes may be made to FIG. 4. For example, FIG. 4 illustrates a generic implant meant to represent a wide range of potential implantable medical devices that could use a frequency-locked synthesizer. Any suitable implantable medical device using a wireless transceiver, transmitter, or receiver could use a frequency-locked synthesizer such as the one described above.

Figure 5:
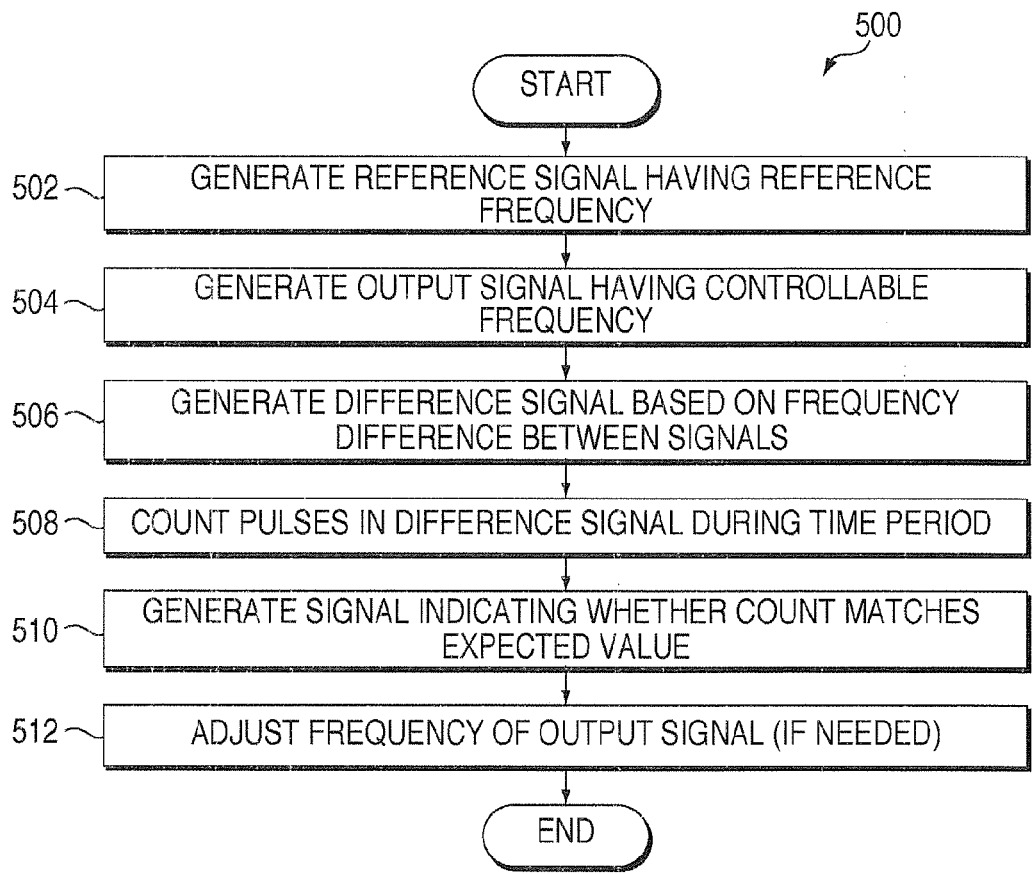
FIG. 5 illustrates an example method for using a frequency-locked synthesizer according to this disclosure.

FIG. 5 illustrates an example method 500 for using a frequency-locked synthesizer according to this disclosure. As shown in FIG. 5, a reference signal having a reference frequency is generated at step 502. This could include, for example, generating a reference signal using a SAW-stabilized oscillator 102. The oscillator 102 could have any suitable operating frequency, such as a frequency of about 389 MHz.

An output signal having a controllable frequency is generated at step 504. This could include, for example, generating an output signal using the VCO 112. The VCO 112 could generate an output signal having any suitable frequency, such as a frequency between about 402 MHz and about 405 MHz.

A frequency difference between the oscillator's reference signal and the VCO's output signal is identified and a difference signal is generated at step 506. This could include, for example, using the frequency difference detector 104 to mix the reference signal and the output signal, where the resulting signal can identify the frequency difference between the two signals. In particular embodiments, the resulting signal has a frequency from about 3 MHz to about 16 MHz.

Pulses in the difference signal are counted during a defined time period at step 508. This could include, for example, the digital frequency discriminator 108 counting pulses in the output of the frequency difference detector 104 during a time period defined by a gating signal. The width of the gating signal defines the time period in which the pulses are counted, and the width of the gating signal is adjustable depending on the application.

A signal is generated indicating whether the counted number of pulses matches an expected value at step 510. This could include, for example, the discriminator 108 outputting a high signal if the counted number of pulses is too high. This could also include the discriminator 108 outputting a low signal if the counted number of pulses is too low. This could further include the discriminator 108 tri-stating its output or outputting a third signal if the counted number of pulses matches the expected value.

A frequency of the output signal is adjusted if needed at step 512. This could include, for example, the VCO 112 reducing the frequency of the output signal if the discriminator 108 indicates that the counted number of pulses is too high. This could also include the VCO 112 increasing the frequency of the output signal if the discriminator 108 indicates that the counted number of pulses is too low.

Although FIG. 5 illustrates one example of a method 500 for using a frequency-locked synthesizer, various changes may be made to FIG. 5. For example, while shown as a series of steps, various steps in FIG. 5 could overlap, occur in parallel, occur in a different order, or occur any number of times.

It may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with" and its derivatives mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
   a first oscillator configured to generate a reference signal;
   a second oscillator configured to generate an output signal having a controllable frequency;
   a frequency difference detector configured to generate a difference signal having multiple pulses based on a frequency difference between the reference signal and the output signal; and
   a discriminator configured to count a number of pulses in the difference signal during a specified time period and to modify the frequency of the output signal based on the counted number of pulses.

2. The apparatus of claim 1, wherein the specified time period is adjustable.

3. The apparatus of claim 1, wherein the discriminator is configured to:
   output a first signal when the counted number of pulses is greater than an expected number of pulses; and
   output a second signal when the counted number of pulses is less than the expected number of pulses.

4. The apparatus of claim 3, wherein the discriminator is configured to one of:
   tri-state its output when the counted number of pulses matches the expected number of pulses; and
   output a third signal when the counted number of pulses matches the expected number of pulses.

5. The apparatus of claim 1, wherein:
   the first oscillator comprises a surface acoustic wave-stabilized oscillator; and
   the second oscillator comprises a voltage controlled oscillator.

6. The apparatus of claim 1, further comprising:
   an amplifier configured to amplify the output signal.

7. The apparatus of claim 1, further comprising:
   a first filter configured to receive and filter the difference signal and to provide a filtered difference signal to the discriminator; and
   a second filter configured to receive and filter an output of the discriminator and to provide a filtered discriminator output to the second oscillator.

8. An apparatus comprising:
   a first oscillator configured to generate a reference signal;
   a second oscillator configured to generate an output signal having a controllable frequency;
   a frequency difference detector configured to generate a difference signal based on a frequency difference between the reference signal and the output signal;
   a first filter configured to receive and filter the difference signal;
   a discriminator configured to modify the frequency of the output signal based on a filtered difference signal; and
   a second filter configured to receive and filter an output of the discriminator and to provide a filtered discriminator output to the second oscillator.

9. A system comprising:
   a synthesizer comprising:
      a first oscillator configured to generate a reference signal;
      a second oscillator configured to generate an output signal having a controllable frequency;
      a frequency difference detector configured to generate a difference signal based on a frequency difference between the reference signal and the output signal; and
      a discriminator configured to modify the frequency of the output signal based on the difference signal; and
   a transmitter, a receiver or a transceiver configured to receive and use the output signal;
   wherein the synthesizer is configured to provide the output signal to a mixer in the receiver or the transceiver; and
   wherein the mixer is configured to down-convert an incoming signal using the output signal.

10. The system of claim 9, wherein:
    the first oscillator comprises a surface acoustic wave-stabilized oscillator; and
    the second oscillator comprises a voltage controlled oscillator.

11. The system of claim 9, wherein:
    the frequency difference detector is configured to generate the difference signal having multiple pulses; and
    the discriminator is configured to count a number of pulses in the difference signal during a specified time period and to modify the frequency of the output signal based on the counted number of pulses.

12. A system comprising:
    a synthesizer comprising:
       a first oscillator configured to generate a reference signal;
       a second oscillator configured to generate an output signal having a controllable frequency;
       a frequency difference detector configured to generate a difference signal based on a frequency difference between the reference signal and the output signal; and
       a discriminator configured to modify the frequency of the output signal based on the difference signal; and
    a transmitter or a transceiver configured to receive and use the output signal;
    wherein the synthesizer is configured to generate the output signal and to modulate data onto the output signal; and
    wherein the synthesizer is configured to provide the output signal to the transmitter or the transceiver.

13. The system of claim 12, wherein:
    the frequency difference detector is configured to generate the difference signal having multiple pulses; and
    the discriminator is configured to count a number of pulses in the difference signal during a specified time period and to modify the frequency of the output signal based on the counted number of pulses.

14. A system comprising:
    a synthesizer comprising:
       a first oscillator configured to generate a reference signal;
       a second oscillator configured to generate an output signal having a controllable frequency;
       a frequency difference detector configured to generate a difference signal having multiple pulses based on a frequency difference between the reference signal and the output signal; and
       a discriminator configured to count a number of pulses in the difference signal during a specified time period and to modify the frequency of the output signal based on the counted number of pulses; and
    at least one of: a transmitter, a receiver, or a transceiver configured to receive and use the output signal.

15. The system of claim 14, wherein the specified time period is adjustable.

16. The system of claim 14, wherein the discriminator is configured to:
   output a first signal when the counted number of pulses is greater than an expected number of pulses; and
   output a second signal when the counted number of pulses is less than the expected number of pulses.

17. The system of claim 16, wherein the discriminator is configured to one of:
   tri-state its output when the counted number of pulses matches the expected number of pulses; and
   output a third signal when the counted number of pulses matches the expected number of pulses.

18. A system comprising:
   a synthesizer comprising:
      a first oscillator configured to generate a reference signal;
      a second oscillator configured to generate an output signal having a controllable frequency;
      a frequency difference detector configured to generate a difference signal based on a frequency difference between the reference signal and the output signal;
      a first filter configured to receive and filter the difference signal;
      a discriminator configured to modify the frequency of the output signal based on a filtered difference signal; and
      a second filter configured to receive and filter an output of the discriminator and to provide a filtered discriminator output to the second oscillator; and
   at least one of: a transmitter, a receiver, or a transceiver configured to receive and use the output signal.

19. A method comprising:
   generating a reference signal;
   generating an output signal having a controllable frequency;
   generating a difference signal having multiple pulses based on a frequency difference between the reference signal and the output signal; and
   modifying the frequency of the output signal based on the difference signal, wherein modifying the frequency of the output signal comprises:
      counting a number of pulses in the difference signal during a specified time period; and
      modifying the frequency of the output signal based on the counted number of pulses.

20. The method of claim 19, wherein modifying the frequency of the output signal based on the counted number of pulses comprises:
   reducing the frequency of the output signal when the counted number of pulses is greater than an expected number of pulses; and
   increasing the frequency of the output signal when the counted number of pulses is less than the expected number of pulses.

* * * * *